United States Patent

Brug et al.

[11] Patent Number: 6,081,446
[45] Date of Patent: Jun. 27, 2000

[54] MULTIPLE BIT MAGNETIC MEMORY CELL

[75] Inventors: James A. Brug, Menlo Park; Manoj K. Bhatacharyya, Cupertino, both of Calif.

[73] Assignee: Hewlett-Packard Company, Palo Alto, Calif.

[21] Appl. No.: 09/089,947

[22] Filed: Jun. 3, 1998

[51] Int. Cl.[7] .................................................. G11C 11/14
[52] U.S. Cl. .......................................... 365/171; 365/173
[58] Field of Search ............................... 365/97, 171, 173

[56] References Cited

U.S. PATENT DOCUMENTS

| | | | |
|---|---|---|---|
| 3,707,706 | 12/1972 | Kefalas. | 340/174 |
| 5,703,805 | 12/1997 | Tehrani et al. | 365/173 |
| 5,734,605 | 3/1998 | Zhw. | 365/173 |
| 5,764,567 | 6/1998 | Parkin | 365/173 |
| 5,768,183 | 6/1998 | Zhu et al. | 365/173 |
| 5,828,598 | 10/1998 | Zhen et al. | 365/173 |

OTHER PUBLICATIONS

European Search Report, Application No. EP 99 30 4212, dated Jul 20, 1999.

Zhigang Wang, et al. "Quarternary Giant Magnetoresistance Random Access Memory", Apr. 15, 1996, pp. 6639–6641.

*Primary Examiner*—Son T. Dinh

[57] ABSTRACT

A multiple bit magnetic memory cell includes a data storage layer having a shape which is preselected to provide at least three domain states wherein each domain state corresponds to a particular logic state and a particular orientation of magnetization in the data storage layer. The multiple bit magnetic memory cell includes a reference layer having a fixed orientation of magnetization which is defined by an angle of orientation wherein the angle of orientation is preselected to distinguish the domain states of the data storage layer.

18 Claims, 4 Drawing Sheets

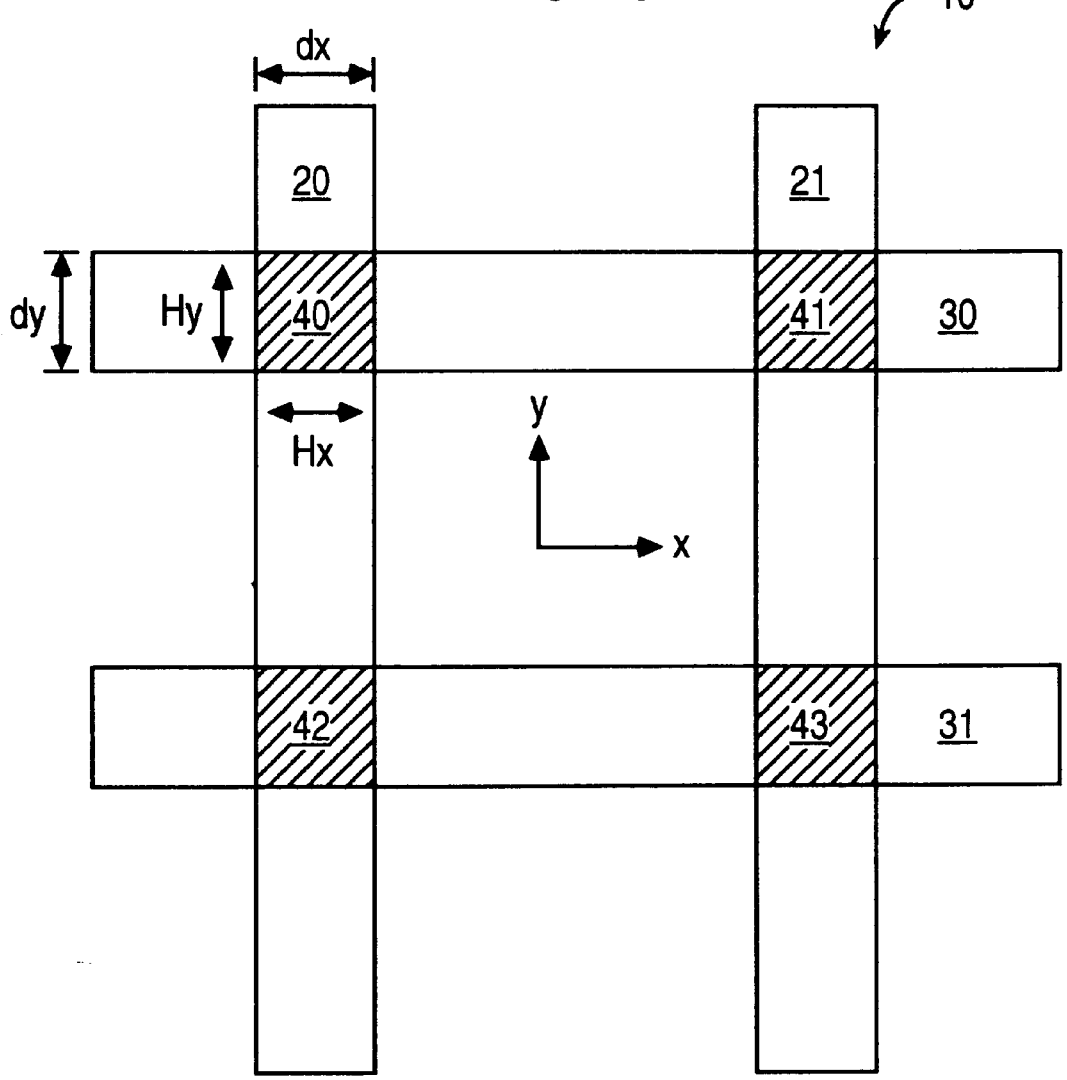

MULTIPLE BIT MAGNETIC MEMORY CELL

BACKGROUND OF THE INVENTION

1. Field of Invention

The present invention pertains to the field of magnetic memories. More particularly, this invention relates to a multiple bit magnetic memory cell.

2. Art Background

A magnetic memory usually includes an array of magnetic memory cells. Typically, each magnetic memory cell uses magnetic fields to store a corresponding bit of information. A magnetic memory also usually includes an array of conductors which provide read and write access to the magnetic memory cells. Such an arrangement of a magnetic memory may be referred to as a magnetic random access memory (MRAM).

Prior magnetic memory cells typically include a data storage layer and a reference layer. The reference layer is usually a layer of magnetic material in which the orientation of magnetization is fixed or "pinned" in a particular direction. The data storage layer is typically a layer of magnetic material in which the orientation of magnetization may be altered by the application of external magnetic fields. This usually occurs during write operations in which electrical currents are applied to the conductors of the magnetic memory to alter the orientation of magnetization in the data storage layer.

Typically, the logic state of a prior magnetic memory cell depends on whether the orientation of magnetization in its data storage layer is parallel or anti-parallel to the orientation of magnetization in its reference layer. Parallel orientations usually cause a magnetic memory cell to be in a low resistance state while anti-parallel orientations usually cause a magnetic memory cell to be in a high resistance state. Typically, the logic state of a magnetic memory cell is read by measuring its resistance.

It would be desirable to provide magnetic memory cells with the capability of storing more that one bit per cell. Such magnetic memory cells would increase the storage density of MRAMs and possibly reduce the overall per bit costs of magnetic memories and systems that employ magnetic memories.

SUMMARY OF THE INVENTION

A multiple bit magnetic memory cell is disclosed which includes a data storage layer having a shape which is preselected to provide at least three domain states wherein each domain state corresponds to a particular logic state of information in the magnetic memory cell and a particular orientation of magnetization in the data storage layer. The multiple bit magnetic memory cell includes a reference layer having a fixed orientation of magnetization which is defined by an angle of orientation wherein the angle of orientation is preselected to distinguish the domain states of the data storage layer.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which:

FIG. 5 is a top view of a magnetic memory which includes an array of multiple bit magnetic memory cells.

DETAILED DESCRIPTION

Figure 1:
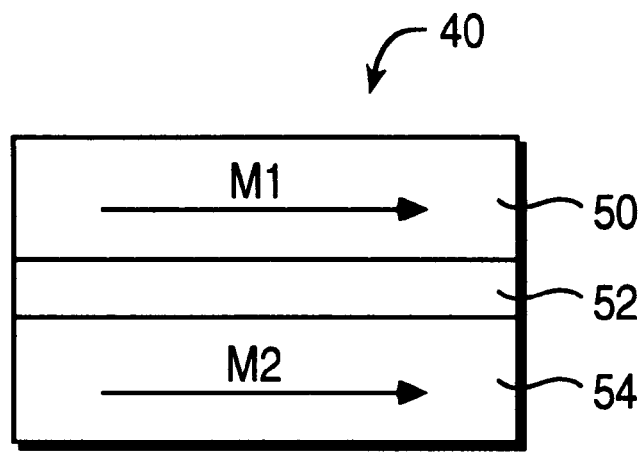
FIG. 1 illustrates the basic structure of a magnetic memory cell that provides multiple bits of storage.

FIG. 1 illustrates the basic structure of a magnetic memory cell 40 that provides multiple bits of storage. The magnetic memory cell 40 includes a data storage layer 50 and a reference layer 54.

The magnetic memory cell 40 provides a set of at least three logic states which yield multiple bits of information storage. The logic states of the magnetic memory cell 40 correspond to the relative orientations of magnetization in the data storage layer 50 and the reference layer 54. The orientation of magnetization in the data storage layer 50 may be represented by a vector M1. The orientation of magnetization in the reference layer 54 may be represented by a vector M2.

The orientation of magnetization M2 is fixed in a particular direction. The orientation of magnetization M1, on the other hand, changes depending upon the logic state of the magnetic memory cell 40. Each logic state of the magnetic memory cell 40 corresponds to a particular orientation of M1. The possible orientations of M1 are referred to as the domain states of the data storage layer 50. Thus, the logic state of the magnetic memory cell 40 depends on the domain state of the data storage layer 50. In addition, the domain state of the data storage layer 50 is manipulated by the application of external magnetic fields using conductors associated with the magnetic memory cell 40.

In one embodiment, the data storage layer 50 accommodates four domain states, state 1 through state 4, which corresponds to logic states 0 through 3 of the magnetic memory cell 40. This yields 2 bits of information storage in one magnetic memory cell.

The logic state of the magnetic memory cell 40 is determined by measuring its resistance. The resistance of the magnetic memory cell 40 differs according to the relative orientations of M1 and M2, i.e. the domain state of the data storage layer 50. The resistance of the magnetic memory cell 40 may be measured by applying a read voltage and measuring a resulting sense current.

In one embodiment, the magnetic memory cell 40 includes a tunnel barrier 52 between the data storage layer 50 and the reference layer 54. This structure may be referred to as a spin tunneling device in that electrical charge migrates through the tunnel barrier 52 during read operations. This electrical charge migration through the tunnel barrier 52 is due to a phenomenon known as spin tunneling and occurs when a read voltage is applied to the magnetic memory cell 40. In an alternative embodiment, a giant magneto-resistive structure may be used in the magnetic storage device 40.

Figure 2:
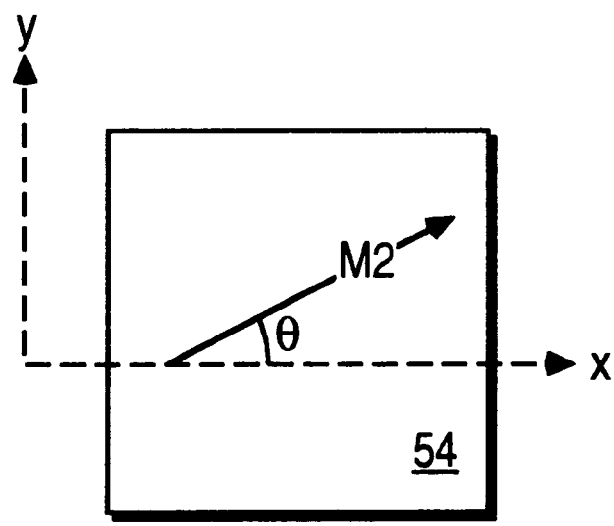
FIG. 2 shows a top view of a reference layer of a multiple bit magnetic memory cell.

FIG. 2 shows a top view of the reference layer 54 of the magnetic memory cell 40. Also shown is the M2 vector which represents the fixed orientation of magnetization of the reference layer 54. The M2 vector forms an angle θ with respect to an x axis.

The orientation of magnetization M2 having the angle θ may be realized using a variety of known techniques. For example, the reference layer 54 may be a permalloy layer such as nickel-iron (NiFe) which is coupled to an antiferromagnetic layer that pins the orientation of magnetization in the permalloy layer. The antiferromagnetic material may be iron-manganese (FeMn) or nickel-manganese (NiMn). Alternative materials for the antiferromagnetic material include NiO, TbCo, PtMn, and IrMn.

The angle θ of M2 may be accomplished by applying a strong magnetic field such as 1000 oersteds in a direction parallel to the desired M2 vector and heating the magnetic memory cell 40 to a high temperature such as 300 degrees C. The magnetic memory cell 40 is then cooled in the presence of this magnetic field to fix the orientation of magnetization in the antiferromagnetic material in a direction parallel to the desired angle θ. Magnetic exchange coupling between the annealed antiferromagnetic material and the permalloy material of the reference layer 54 pins M2 to the desired angle θ.

Alternatively, the reference layer 54 may be a material with a high coercivity such as a cobalt-platinum alloy. A magnetic field of sufficient strength may be applied to the reference layer 54 to fix the orientation of magnetization M2 to the desired angle θ. The relatively high coercivity of the reference layer 54 would prevent switching of M2 in the presence of external magnetic fields that are applied during write operations to the magnetic memory cell 40.

FIGS. 3a–3d illustrate the four domain states of the data storage layer 50 in one embodiment of the magnetic memory cell 40. A vector 60 which is parallel to the x direction represents an orientation of magnetization in the interior of the data storage layer 50. The vector 60 is parallel to what may be referred to as the easy axis of the data storage layer 50.

A set of vectors 61–64 represent orientations of magnetization which are associated with the end regions of magnetic materials. The magnetizations represented by the vectors 61–64 are oriented in directions that are substantially parallel to the edges of the data storage layer 50. In prior magnetic memory cells, the dimensions $d_x$ and $d_y$ of a data storage layer are typically selected in order to minimize the fields in the end regions and maximize the magnetization that is along the easy axis. In such prior magnetic memory cells, $d_x$ is usually greater than $d_y$ which yields a rectangular shape with a long dimension along the easy axis.

Rather than try to minimize the magnetization in the end regions, the present techniques make use of these magnetization in the end regions in order to obtain additional domain states in the data storage layer 50. Accordingly, the dimensions $d_x$ and $d_y$ are selected to be equal and form a square shape for the data storage layer 50. The four domain states of the data storage layer 50 are realized by manipulating not only the direction of the vector 60 along the easy axis but also by manipulating the directions of the vectors 61–64 in the end regions of the data storage layer 50 as shown.

The square shape of the data storage layer 50 not only yields additional domain states but also enhances the density that may be obtained in an MRAM in comparison to that which may be obtained when using rectangular memory cells. This is so because for a given minimum feature size more square magnetic memory cells may be formed on a given substrate area than rectangular magnetic memory cells.

Figure 3A:
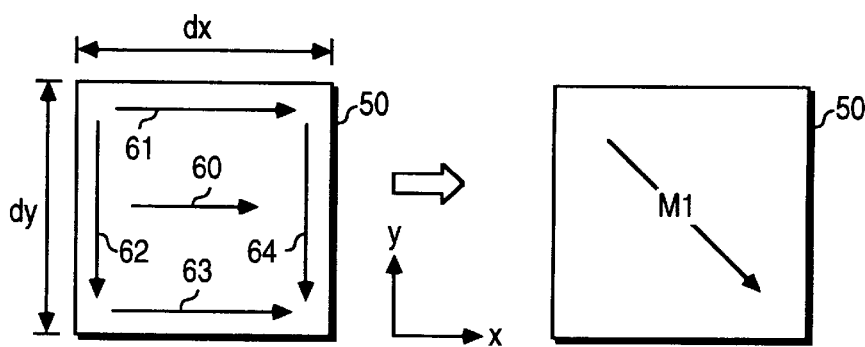
FIGS. 3a–3d illustrate the four domain states of the data storage layer in one embodiment of a multiple bit magnetic memory cell.

FIG. 3a illustrates the domain state 1 of the data storage layer 50 and shows the directions of the vectors 60–64. As shown, the orientation of magnetization M1 is a resulting vector of the vectors 60–64 and points in a +x, −y direction.

Figure 3B:
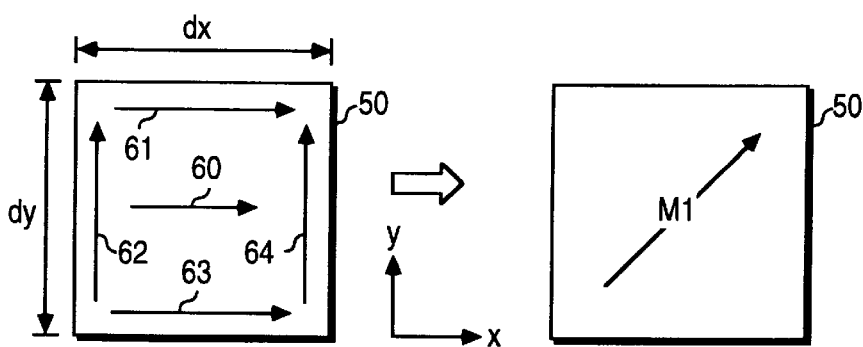

FIG. 3b illustrates the domain state 2 of the data storage layer 50. The orientation of magnetization M1 is a resulting vector of the vectors 60–64 and points in a +x, +y direction.

Figure 3C:
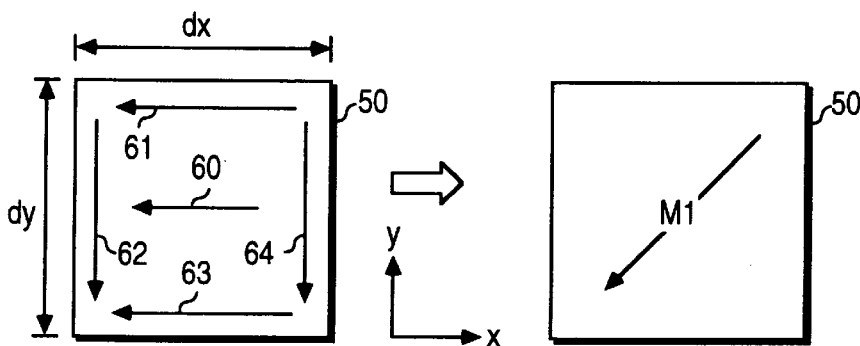

FIG. 3c illustrates the domain state 3 of the data storage layer 50. The orientation of magnetization M1 points in a −x, −y direction.

Figure 3D:
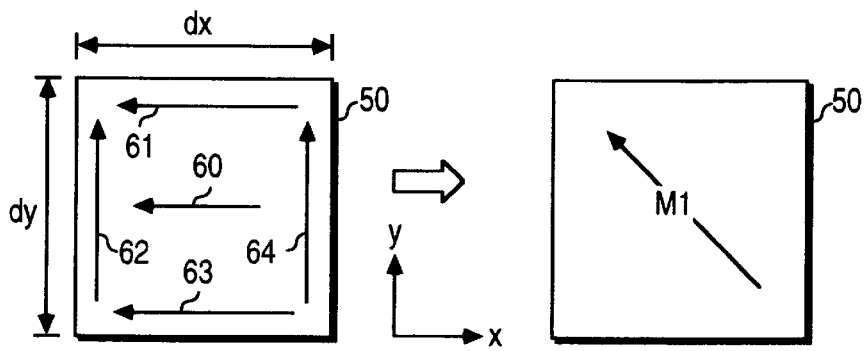

FIG. 3d illustrates the domain state 4 of the data storage layer 50. The orientation of magnetization M1 points in a −x, +y direction.

In one embodiment, the material parameters and the geometry of the data storage layer 50 are optimized so that the x and y components of M1 are equal in each of the domain states 1–4. This optimization depends on the magnetization distribution in the data storage layer 50, the film thickness of the data storage layer 50, the $d_x$ and $d_y$ dimensions, and the type of material selected for the data storage layer 50. In one embodiment, a permalloy layer such as nickel-iron may he used as the main body of the data storage layer 50 with a thin polarization enhancing film at the interface to the tunnel barrier 52.

The resistance of the magnetic memory cell 40 depends on the relative orientations of M1 and M2. The orientation of M1 depends on the domain state of the data storage layer 50. The orientation of M2 is fixed and is defined by the angle θ. It is desirable to select the angle θ so that a relatively equal change in resistance of the magnetic memory cell 40 is detected between changes in the domain states 1–4.

Figure 4:
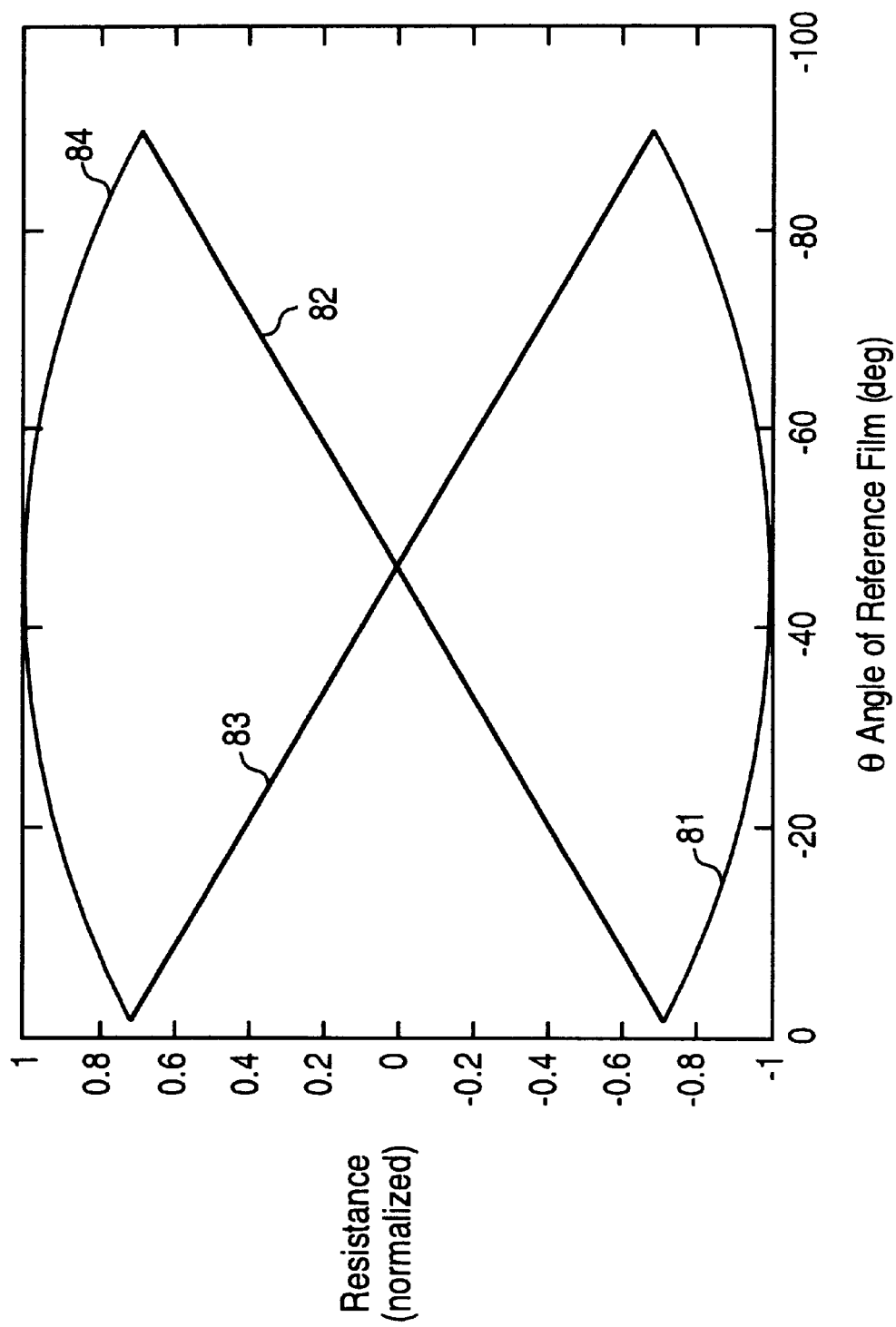
FIG. 4 shows the relationship between the measured resistance of a multiple bit magnetic memory cell and the angle θ of its reference later for each of the domain states of its data storage layer.

FIG. 4 shows the relationship between measured resistance of the magnetic memory cell 40 and the angle θ for each of the domain states 1–4. A set of curves 81–84 represent calculations associated with the domain states 1–4, respectively. The curves 81–84 may be used to select an angle θ at which there is an equal change in signal in going from one domain state to another.

In an embodiment in which the x and y components of M1 are equal, the selected angle θ is 26.6 degrees. Other angles are suitable. For example, angles that are 90 degrees relative to 26.6 degrees. In addition, less optimal angles may be chosen which do not yield equal changes in measured resistance between the domain states 1–4.

A selection of 45 degrees for θ results in a three state device. This yields fewer states but higher resistance changes between states which may be desirable in some applications.

FIG. 5 is a top view of a magnetic memory 10 which includes an array of magnetic memory cells comprising the magnetic memory cell 40 along with additional magnetic memory cells 41–43. The magnetic memory 10 also includes an array of conductors 20–21 and 30–31 that enable read and write access to the magnetic memory cells 40–43. The conductors 30–31 are top conductors and the conductors 20–21 are orthogonal bottom conductors. Each of the magnetic memory cells 40–43 has dimensions $d_x$ and $d_y$.

The logic states of the magnetic memory cells 40–43 are manipulated by manipulating the domain states of their respective data storage layers. These domain states are manipulated by applying electrical currents to the conductors 20–21 and 30–32.

For example, an electrical current applied to the conductor 30 in the +x direction causes a magnetic field ($H_{y+}$) in the data storage layer 50 in the +y direction according to the right-hand rule. An electrical current applied to the conductor 30 in the −x direction causes a magnetic field ($H_{y-}$) in the data storage layer 50 in the −y direction. Similarly, an electrical current applied to the conductor 20 in the +y direction causes a magnetic field ($H_{x+}$) in the data storage layer 50 in the +x direction, while an electrical current applied to the conductor 20 in the −y direction causes a magnetic field ($H_{x-}$) in the data storage layer 50 in the −x direction. These induced magnetic fields $H_{x+}$, $H_{x-}$, $H_{y+}$, and $H_{y-}$ may be used to alter the directions of the vectors 60–64, thereby changing the domain state of the data storage layer 50 and the logic state of the magnetic memory cell 40.

A transition from domain state 1 to domain state 2 may be accomplished with the following procedure. First, apply an $H_{x+}$ field in order to enable the magnetic memory cell 40. Next, apply an $H_{y+}$ field to flip the vectors 62 and 64 from the −y to the +y direction. Next, remove the $H_{y+}$ field. Finally, remove the $H_{x+}$ field. Many other sequences of the magnetic fields $H_{x+}$, $H_{x-}$, $H_{y+}$, and $H_{y-}$ may be used to switch the magnetic memory cell 40.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A multiple bit magnetic memory cell, comprising:

data storage layer having a shape which is preselected to provide at least three domain states wherein each domain state corresponds to a particular orientation of magnetization in the data storage layer, wherein the shape is a square having four end regions and an interior region; and reference layer having a fixed orientation of magnetization which is defined by an angle of orientation wherein the angle of orientation is preselected to distinguish the domain states of the data storage layer.

2. The multiple bit magnetic memory cell of claim 1, wherein each domain state is defined by a resulting vector from a set of vectors which represent an orientation of magnetization in each end region and an orientation of magnetization in the interior region.

3. The multiple bit magnetic memory cell of claim 1, wherein the angle of orientation is selected to distinguish three domain states in the data storage layer.

4. The multiple bit magnetic memory cell of claim 1, wherein the angle of orientation is selected to distinguish four domain states in the data storage layer.

5. The multiple bit magnetic memory cell of claim 1, wherein the angle of orientation is selected to yield a substantially equal change in a resistance of the magnetic memory cell between domain states.

6. The multiple bit magnetic memory cell of claim 1, wherein each of a set of logic states of the magnetic memory cell corresponds to a particular one of the domain states of the data storage layer.

7. The multiple bit magnetic memory cell of claim 6, wherein a particular logic state of the magnetic memory cell is written by applying a sequence of external magnetic fields to cause the data storage layer to switch between the domain states.

8. A magnetic memory, comprising:

array of magnetic memory cells, each comprising a data storage layer having a shape which is preselected to provide at least three domain states wherein each domain state corresponds to a particular orientation of magnetization in the data storage layer, and wherein the shape is a square having four end regions and an interior region, each magnetic memory cell further comprising a reference layer having a fixed orientation of magnetization which is defined by an angle of orientation wherein the angle of orientation is preselected to distinguish the domain states of the data storage layer;

a set of conductors that enable read and write access to the magnetic memory cells.

9. The magnetic memory of claim 8, wherein each domain state is defined by a resulting vector from a set of vectors which represent an orientation of magnetization in each end region and an orientation of magnetization in the interior region.

10. The magnetic memory of claim 8, wherein the angle of orientation is selected to distinguish three domain states in the data storage layer.

11. The magnetic memory of claim 8, wherein the angle of orientation is selected to distinguish four domain states in the data storage layer.

12. The magnetic memory of claim 8, wherein the angle of orientation is selected to yield a substantially equal change in a resistance of each magnetic memory cell between domain states.

13. The magnetic memory of claim 8, wherein each of a set of logic states of each magnetic memory cell corresponds to a particular one of the domain states of the data storage layer.

14. The magnetic memory of claim 13, wherein a particular logic state of each magnetic memory cell is written by applying a sequence of external magnetic fields to cause the data storage layer to switch between the domain states.

15. The magnetic memory of claim 14, wherein the sequence of external magnetic fields are applied by applying electrical currents to the conductors.

16. The magnetic memory of claim 14, wherein the conductors include a set of top conductors and a set of bottom conductors.

17. The magnetic memory of claim 16, wherein the sequence of external magnetic fields are applied by applying an electrical current to one of the top conductors and then applying an electrical current to one of the bottom conductors.

18. The magnetic memory of claim 16, wherein the sequence of external magnetic fields are applied by applying an electrical current to one of the bottom conductors and then applying an electrical current to one of the top conductors.

* * * * *